(12) United States Patent
Na (10) Patent No.: US 7,492,200 B2
(45) Date of Patent: Feb. 17, 2009

(54) DELAYED LOCKED LOOP (DLL)

(75) Inventor: Kwang Jin Na, Anyang-si (KR)

(73) Assignee: Hynix Semiconductor, Inc., Icheon-si (KR)

( * ) Notice: Subject to any disclaimer, the term of this patent is extended or adjusted under 35 U.S.C. 154(b) by 59 days.

(21) Appl. No.: 11/647,904

(22) Filed: Dec. 28, 2006

(65) Prior Publication Data

US 2008/0042704 A1   Feb. 21, 2008

(30) Foreign Application Priority Data

Jun. 29, 2006   (KR) .................... 10-2006-0059891

(51) Int. Cl.
   *H03L 7/06* (2006.01)
(52) U.S. Cl. .................. 327/158; 327/156; 327/161
(58) Field of Classification Search ............... 327/158, 327/156–161, 151–153
   See application file for complete search history.

(56) References Cited

U.S. PATENT DOCUMENTS

| | | | | |
|---|---|---|---|---|
| 6,091,794 | A * | 7/2000 | Rogers ........................ 377/116 |
| 6,504,408 | B1 * | 1/2003 | von Kaenel ................. 327/158 |
| 6,894,549 | B2 * | 5/2005 | Eliason ....................... 327/217 |
| 6,917,228 | B2 * | 7/2005 | Cooper ........................ 327/158 |
| 6,917,229 | B2 * | 7/2005 | Cho ............................. 327/158 |
| 6,959,061 | B1 * | 10/2005 | Kuwata ....................... 375/373 |
| 6,980,042 | B2 * | 12/2005 | LaBerge ...................... 327/291 |
| 6,985,025 | B1 * | 1/2006 | Maksimovic et al. ........ 327/540 |
| 7,082,179 | B2 | 7/2006 | Jung |
| 7,098,709 | B2 * | 8/2006 | Ido et al. .................... 327/156 |
| 7,276,947 | B2 * | 10/2007 | Becker et al. ............... 327/161 |
| 7,285,997 | B2 * | 10/2007 | Haerle et al. ................ 327/158 |
| 7,298,189 | B2 * | 11/2007 | Kang et al. .................. 327/158 |
| 7,327,175 | B2 * | 2/2008 | Lee ............................. 327/158 |
| 7,348,819 | B2 * | 3/2008 | Choi ........................... 327/158 |
| 7,358,784 | B2 * | 4/2008 | Kim et al. ................... 327/158 |
| 2005/0140408 | A1 * | 6/2005 | Lim ............................ 327/158 |
| 2006/0170471 | A1 * | 8/2006 | Haerle et al. ................ 327/158 |
| 2007/0001724 | A1 * | 1/2007 | Na .............................. 327/158 |
| 2007/0069773 | A1 * | 3/2007 | Choi ........................... 327/158 |
| 2007/0069774 | A1 * | 3/2007 | Kim et al. ................... 327/158 |
| 2007/0069783 | A1 * | 3/2007 | Ku et al. ..................... 327/158 |
| 2007/0085581 | A1 * | 4/2007 | Ku .............................. 327/158 |
| 2007/0152723 | A1 * | 7/2007 | Ahn et al. ................... 327/158 |
| 2007/0176657 | A1 * | 8/2007 | Byun et al. ................. 327/158 |
| 2008/0012615 | A1 * | 1/2008 | Park ............................ 327/158 |
| 2008/0054947 | A1 * | 3/2008 | Choi ........................... 327/12 |
| 2008/0054964 | A1 * | 3/2008 | Lee et al. .................... 327/158 |
| 2008/0079470 | A1 * | 4/2008 | Yun et al. ................... 327/158 |
| 2008/0088349 | A1 * | 4/2008 | Lee ............................. 327/158 |

FOREIGN PATENT DOCUMENTS

| | | |
|---|---|---|
| JP | 08-097715 | 4/1996 |
| KR | 10-2000-0018490 A | 4/2000 |
| KR | 10-2001-0059418 A | 7/2001 |
| KR | 10-2004-0103035 A | 12/2004 |

* cited by examiner

*Primary Examiner*—Lincoln Donovan
*Assistant Examiner*—Adam Houston
(74) *Attorney, Agent, or Firm*—John P. White; Cooper & Dunham LLP (57) ABSTRACT

A delayed locked loop (DLL) circuit is provided which reliably provides an initial delay period of a delay line.

30 Claims, 4 Drawing Sheets

| Set | Reset | OUT |
|-----|-------|-----|
| H | H | L |
| L | L | H |
| L | H | $\overline{IN}$ |

DELAYED LOCKED LOOP (DLL)

BACKGROUND

The present disclosure relates to a delayed locked loop (DLL) circuit, and more particularly to a delayed locked loop (DLL) for guaranteeing an initial delay period of a delay line, thereby preventing a locking fail from being generated.

With the increasing degree of integration of a semiconductor memory, the semiconductor memory has been continuously improved to enhance its operation speed. In order to enhance the operation speed of the semiconductor memory, a synchronous memory device capable of being synchronized with a clock signal received from an external part of a memory chip has been recently introduced to the market.

However, if the above-mentioned synchronous memory synchronizes its data with the external clock signal, and outputs the synchronized result, an unexpected delay of "tAC" (output data Access time from Clk) occurs, and the number of valid data windows is reduced, such that an unexpected faulty operation occurs in the synchronous memory which is operating at high frequency. Therefore, in order to allow data to be correctly synchronized with a rising edge or a falling edge of the clock signal, a DLL circuit has been recently developed. The DLL circuit generates a DLL clock signal capable of delaying the external clock signal by a predetermined period denoted by "tCK-tAC", such that the data can be correctly synchronized with the rising- or falling-edge of the clock signal.

The above-mentioned DLL circuit generates an internal clock signal for compensating for internal delay elements of a DRAM by an external clock signal, and this operation of the DDL circuit is generally called a locking state.

The above-mentioned locking state indicates that a reference clock signal (refclk) and a feedback clock signal (fbclk) are synchronized with each other. The conventional DLL adjusts an initial delay period of an initial delay line, and synchronizes the feedback clock signal (fbclk) with the reference clock signal (refclk).

Figure 1A:
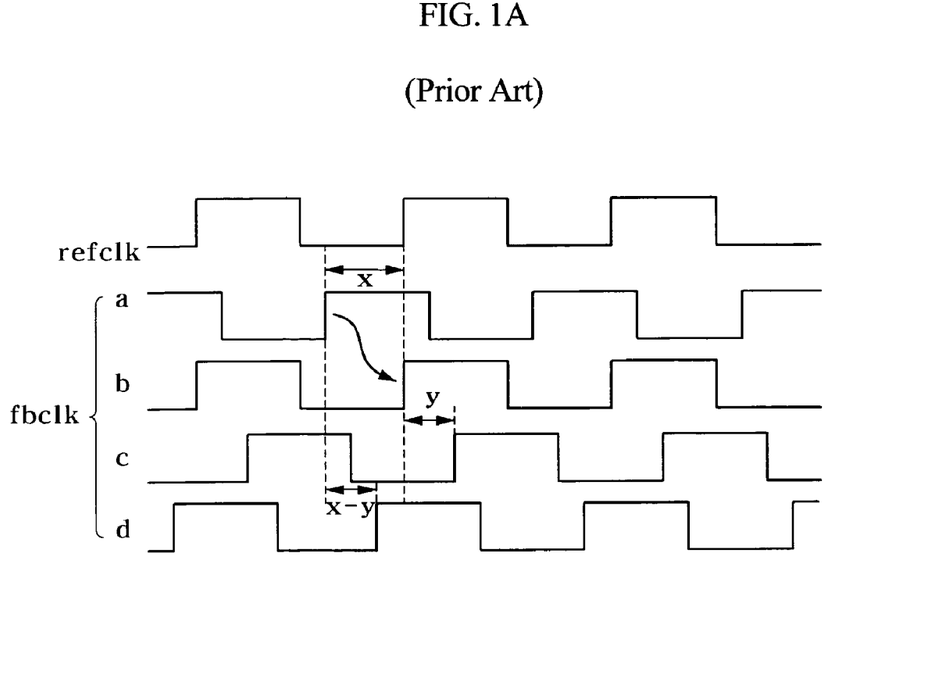
FIGS. 1A and 1B show timing diagrams illustrating a reference clock signal (refclk) and a feedback clock signal (fbclk) of a conventional delayed locked loop (DLL)
Figure 1B:
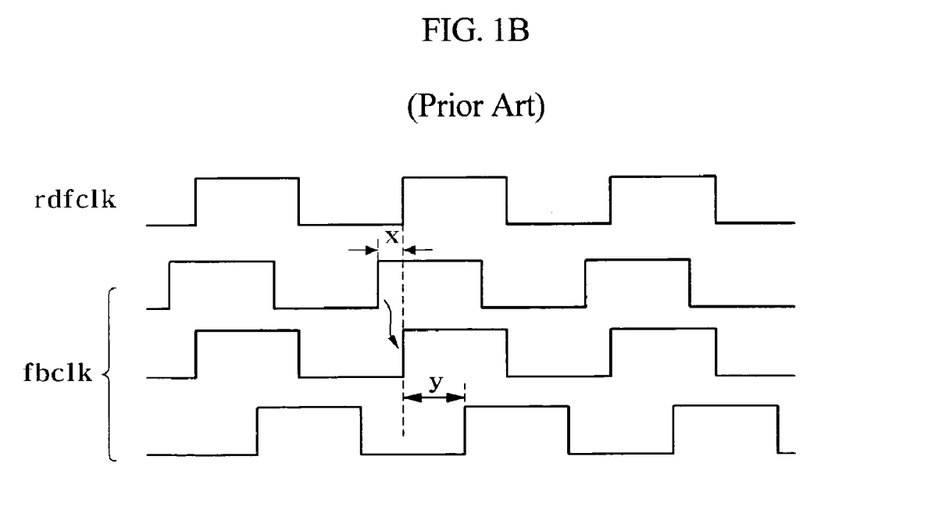

FIGS. 1A and 1B show timing diagrams of the reference clock signal (refclk) and the feedback clock signal (fbclk) of the conventional DLL.

Referring to FIG. 1A, provided that the feedback clock signal (fbclk) enters the (a) state when the initial delay period of the delay line is set to "0", and the initial delay period of the delay line is set to "X", the feedback clock signal (fbclk) enters the (b) state, such that the feedback clock signal (fbclk) is synchronized with the reference clock signal (refclk).

Under this locking state, if an operation voltage of the DLL drops, the feedback clock signal (fbclk) is delayed by a predetermined period (Y), such that it enters the (c) state. As a result, the DLL enters a specific state in which the reference clock signal (refclk) is not synchronized with the feedback clock signal (fbclk). In this case, the specific state is generally called a locking fail state. Under this situation, the DLL adjusts the initial delay period of the delay line, and synchronizes the reference clock signal (refclk) with the feedback clock signal (fbclk), such that it recovers the locking state.

For example, if the feedback clock signal (fbclk) is delayed by a predetermined delay period "Y" due to the drop of the operation voltage, and the initial delay period of the delay line is reduced to a specific value "X-Y", the delay period "Y" increased by the drop of the operation voltage and the other delay period "Y" decreased from the initial delay period are compensated for, the feedback clock (fbclk) enters the (b) state, such that the DLL recovers the locking state.

However, as can be seen from FIG. 1B, if the initial delay period "X" of the delay line is less than the delay period "Y" during which the feedback clock signal (fbclk) is delayed due to the drop of the operation voltage, the initial delay period of the delay line is reduced, such that the DLL cannot recover the locking state.

The above-mentioned problems can be solved by establishing a large-sized initial delay period of the delay line. However, the initial delay period is unnecessarily set to the large-sized delay period even when the initial delay period of the delay line is sufficiently guaranteed, such that it is very vulnerable to power noise.

BRIEF SUMMARY

The present disclosure provides a delayed locked loop (DLL) circuit which can reliably provide an initial delay period of a delay line, thereby preventing a locking fail from being generated.

In a preferred embodiment, a delayed locked loop (DLL) circuit comprises a delay line including a plurality of delay elements, and configured to delay an internal clock signal generated by buffering external clock signals by a first delay period, an internal delay configured to delay an output signal of the delay line by a second delay period determined by modeling delay elements contained in a DRAM, and generate a feedback clock signal, a phase detector configured to generate an enable signal which is enabled when a phase difference between the feedback clock signal and a reference clock signal is contained in a predetermined period, and outputs the enable signal, a delay-period controller configured to generate, in response to the enable signal, first and second control signals for adjusting a counter output signal corresponding to at least one delay element selected from among the delay elements, a counter for receiving the first and second control signals, and generating a counter output signal corresponding to the at least one delay element; and a decoder for decoding the counter output signal, and generating the decoding signal, wherein the decoding signal determines an enable state of the at least one delay element and adjusts the first delay period.

Preferably, the phase detector includes a first phase comparator for receiving the feedback clock signal and the reference clock signal, comparing a phase of the feedback clock signal with a phase of the reference clock signal, and generating a first phase comparison signal according to the result of the comparison, a second phase comparator for receiving not only a clock signal for delaying the feedback clock signal by a third delay period but also the reference clock signal, comparing a phase of the received clock signal with a phase of the reference clock signal, and generating a second phase comparison signal according to the result of the comparison, and a logic unit for receiving a buffering signal of an output signal of the first phase comparator and an output signal of the second phase comparator, performing a logic operation of the received signals, and generating the enable signal.

Preferably, the first and second phase comparators are respective flip-flops.

Preferably, the delay-period controller includes a setup signal generator for receiving the enable signal and the clock signal, and generating first, second, and third setup signals, a start-signal generator for receiving the first, second, and third setup signals, and generating a start signal, a clock signal transmitter configured to transmit, in response to the start signal, the clock signal to the setup signal generator, and a control signal generator configured to generate, in response to the start signal and the second and third setup signals, first and second control signals.

Preferably, the setup signal generator includes first, second, and third flip-flops which are connected in series to each other, are synchronized with the clock signal, and generates the first and second setup signals, in which the enable signal is applied to a data input terminal of the first flip-flop.

Preferably, the start signal generator generates the start signal enabled only when the first to third setup signals have the same logic level.

Preferably, the start signal generator includes a first logic unit for receiving the first to third setup signals, and performing a first logic operation of the first to third setup signals, a second logic unit for receiving the first to third setup signals, and performing a second logic operation of the first to third setup signals, and a third logic unit for receiving an output signal of the first logic unit and an output signal of the second logic unit, performing a third logic operation of the received signals, and generating the start signal.

Preferably, the clock signal transmitter includes a logic element for receiving the start signal and a buffering signal of the clock signal, and performing a logic operation of the received signals.

Preferably, the control signal generator includes a flip-flop for receiving the start signal at its data input terminal, and receiving the clock signal at its clock input terminal, a first logic unit for receiving the second and third setup signals, and performing a logic operation of the second and third setup signals, a second logic unit for receiving a signal of a data output terminal of the flip-flop and an output signal of the first logic unit, performing a logic operation of the received signals, and generating the first control signal, and a third logic unit for receiving an output signal of the flip-flop and an output signal of the first logic unit, performing a logic operation of the received signals, and generating the second control signal.

Preferably, the counter includes a pull-up drive configured to pull-up the first and second control signals and an input signal, and a pull-down drive configured to pull-down the first and second control signal and the input signal.

Preferably, the pull-up drive includes first and second pull-up elements which are connected in series between a power-supply voltage terminal and a first node at which the counter output signal is generated, and pull-up-drive the first node in response to the first control signal and the input signal, and a third pull-up element which is connected between the power-supply voltage terminal and the first node, and pull-up-drives the first node in response to the second control signal.

Preferably, the first to third pull-up elements are respective PMOS transistors.

Preferably, the pull-down drive includes first and second pull-down elements which are connected in series between a ground terminal and the first node, and pull-down drive the first node in response to the second control signal and the input signal, and a third pull-down element which is connected between the ground terminal and the first node, and pull-down drives the first node in response to the first control signal.

Preferably, the first to third pull-down elements are respective NMOS transistors.

In another embodiment, a delayed locked loop (DLL) circuit comprises a delay line for including a plurality of delay elements, and delaying an internal clock signal generated by buffering external clock signals by a first delay period, an internal delay for delaying an output signal of the delay line by a second delay period determined by modeling delay elements contained in a DRAM, and generating a feedback clock signal, and a variable delay for generating a control signal to adjust a first delay period of the delay line when a phase difference between the feedback clock signal and a reference clock signal is contained in a predetermined period.

Preferably, the variable delay includes a phase detector for generating an enable signal enabled when a phase difference between the feedback clock signal and a reference clock signal is contained in a predetermined period, and outputs the enable signal, and a delay-period controller configured to generate, in response to the enable signal, first and second control signals for adjusting a counter output signal of at least one delay element selected from amongst the delay elements.

BRIEF DESCRIPTION OF THE DRAWINGS

The above and other objects, features and other advantages of the subject matter of the present disclosure will be more clearly understood from the following detailed description taken in conjunction with the accompanying drawings, in which.

DESCRIPTION OF SPECIFIC PREFERRED EMBODIMENTS

Specific preferred embodiments of the present disclosure will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present disclosure rather unclear.

Figure 2:
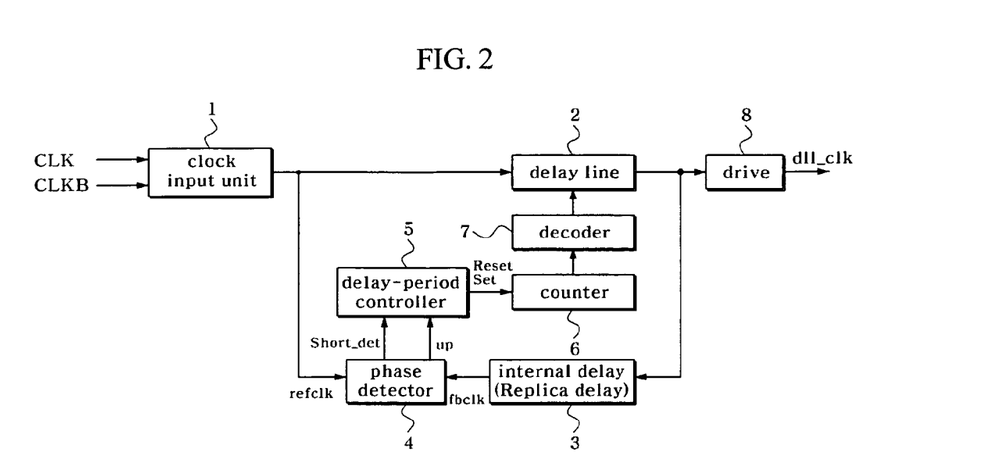
FIG. 2 shows a block diagram illustrating a delayed locked loop (DLL) according to a preferred embodiment of the present disclosure.

FIG. 2 is a block diagram illustrating a delayed locked loop (DLL) according to a preferred embodiment of the present disclosure.

Referring to FIG. 2, the DLL according to the preferred embodiment includes a delay line 2, an internal delay (also called "Replica delay") 3, a phase detector 4, a delay-period controller 5, a counter 6, and a decoder 7.

The delay line 2 includes a plurality of delay elements, such that it delays an internal clock signal generated by buffering external clock signals (CLK and CLKB) by a first delay period. The internal delay 3 delays an output signal of the delay line by a second delay period determined by modeling delay elements contained in a DRAM, such that it generates a feedback clock signal (fbclk). The phase detector 4 generates an enable signal (short_det) enabled when the phase difference between the feedback clock signal (fbclk) and the reference clock signal (refclk) is contained in a predetermined period, and outputs the enable signal (short_det).

The delay-period controller 5 generates, in response to the enable signal (short_det), first and second control signals (Set and Reset) for adjusting a counter output signal of at least one delay element selected from among the delay elements. The counter 6 receives the first and second control signals (Set and Reset), and generates a counter output signal of the at least one delay element. The decoder 7 decodes the counter output signal, and generates the decoding signal, wherein the decoding signal determines an enable state of the at least one delay element and adjusts the first delay period.

Figure 3:
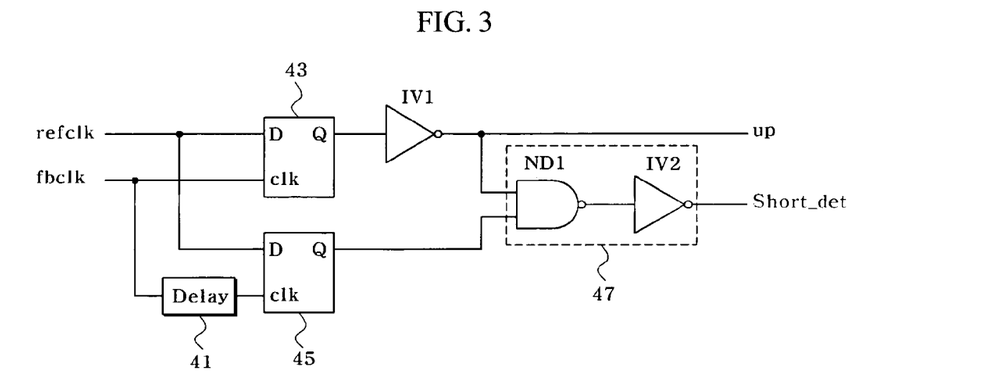
FIG. 3 shows a detailed circuit diagram illustrating a phase detector contained in the DLL shown in FIG. 2.

FIG. 3 is a detailed circuit diagram illustrating a phase detector contained in the DLL shown in FIG. 2 according to a preferred embodiment.

Referring to FIG. 3, the phase detector 4 includes a first flip-flop 43, a second flip-flop 45, and a logic unit 47.

The first flip-flop 43 receives the feedback clock signal (fbclk) and the reference clock signal (refclk), compares a phase of the feedback clock signal (fbclk) with a phase of the reference clock signal (refclk), and generates a first phase comparison signal according to the result of the comparison. The second flip-flop 45 receives not only a clock signal for delaying the feedback clock signal (fbclk) by a third delay period via a delay unit 41 but also the reference clock signal (refclk), compares a phase of the received clock signal with a phase of the reference clock signal (refclk), and generates a second phase comparison signal according to the result of the comparison. The logic unit 47 includes a NAND gate (ND1) and an inverter (IV2), receives the buffering signal of the output signal of the first flip-flop 43 from an inverter (IV1), receives the output signal of the second flip-flop 45, performs an AND operation of the received signals, and generates the enable signal (short_det).

In this case, the first and second flip-flops 43 and 45 are indicative of respective D-flip-flops, such that they compare a phase of a clock signal received via a clock input terminal (clk) with a phase of a clock signal received via a data input terminal (D).

For example, if the reference clock signal (refclk) transmitted from the rising edge of the feedback clock signal (fbclk) received at the clock input terminal (clk) to the data input terminal (D) is at a logic high-level, the first flip-flop 43 outputs a high-level signal to a data output terminal (Q). This means that the phase of the reference clock signal (refclk) is leading the feedback clock signal (fbclk). In this case, the DLL operation enable signal (up) generated by buffering the output signal of the first flip-flop 43 via the inverter (IV1) serves as a general DLL operation signal.

Figure 4A:
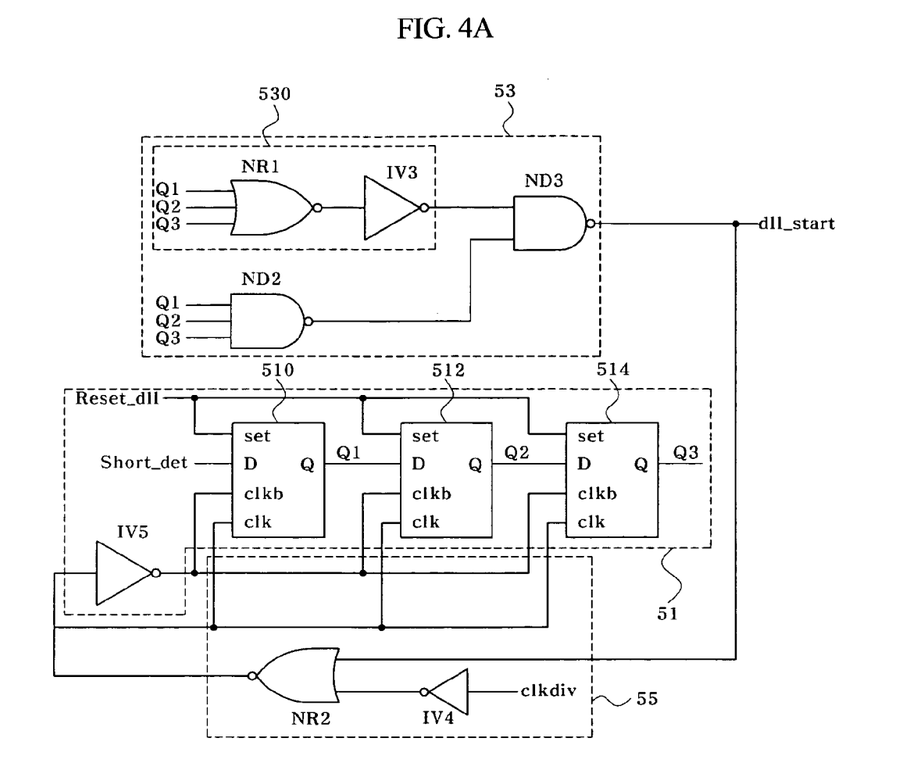
FIGS. 4A and 4B show detailed circuit diagrams illustrating a delay-period controller in the DLL shown in FIG. 2.
Figure 4B:
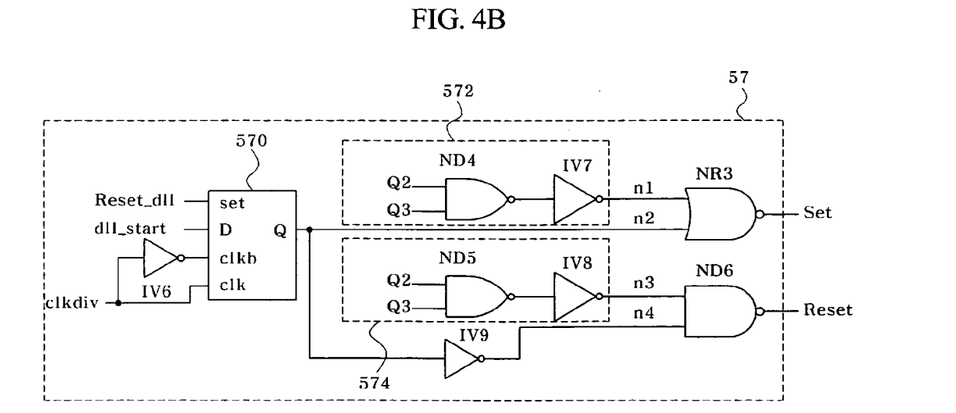

FIGS. 4A and 4B are detailed circuit diagrams illustrating a delay-period controller shown in FIG. 2 according to a preferred embodiment.

Referring to FIGS. 4A and 4B, the delay-period controller 4 includes a setup signal generator 51, a start-signal generator 53, a clock signal transmitter 55, and a control signal generator 57.

The setup signal generator 51 receives the enable signal (short_det) and the clock signal (clkdiv), and generates first, second, and third setup signals (Q1, Q2, and Q3). The start-signal generator 53 receives the first, second, and third setup signals (Q1, Q2, and Q3), and generates a start signal (dll_start). The clock signal transmitter 55 transmits, in response to the start signal (dll_start), the clock signal (clkdiv) to the setup signal generator 51. The control signal generator 57 generates, in response to the start signal (dll_start) and the second and third setup signals (Q2 and Q3), first and second control signals (Set and Reset).

In this case, the setup signal generator 51 includes first, second, and third flip-flops 510, 512, and 514, which are connected in series to each other, are initialized by an initialization signal (Reset_dll), receive the clock signal (clkdiv) at each clock input terminal (elk), and receive the inverting signal of the clock signal (clkdiv) at each clock input terminal (clkb).

The first flip-flop 510 receives the start signal (dll_start) at the data input terminal (D), and outputs a first setup signal (Q1) to the data output terminal (Q). The second flip-flop 512 connects the data input terminal (D) to the data output terminal (Q) of the first flip-flop 510, and outputs a second setup signal to the data output terminal (Q). The third flip-flop 514 connects the data input terminal (D) to the data output terminal (Q) of the second flip-flop 512, and outputs a third setup signal (Q3) to the data output terminal (Q).

The start signal generator 53 includes a logic unit 530, a NAND gate (ND2), and another NAND gate (ND3).

The logic unit 530 includes a NOR gate (NR1) and an inverter (IV3), receives the first to third setup signals (Q1, Q2, and Q3), and performs an OR operation of the first to third setup signals (Q1, Q2, and Q3). The NAND gate (ND2) receives the first to third setup signals (Q1, Q2, and Q3), and performs a NAND operation of the first to third setup signals (Q1, Q2, and Q3). The NAND gate (ND3) receives the output signal of the logic unit 530 and the output signal of the NAND gate (ND2), performs a NAND operation of the received signals, and generates the start signal (dll_start). As a result, the logic unit 530 generates the start signal (dll_start) enabled only when the first to third setup signals (Q1, Q2, and Q3) are at the same level.

The clock signal transmitter 55 includes a NOR gate (NR2). The NOR gate (NR2) receives the buffering signal of the clock signal (clkdiv) from the inverter (IV4), receives the start signal (dll_start) from the start signal generator 53, and performs a NOR operation of the received signals. In this case, the clock signal transmitter 55 determines transmission or non-transmission of the clock signal (clkdiv), in response to the start signal (dll_start). If the start signal (dll_start) enters a logic low level, the clock signal transmitter 55 transmits the clock signal (clkdiv) to the setup signal generator 51. Otherwise, if the start signal (dll_start) enters a logic high level, the clock signal transmitter 55 does not transmit the clock signal (clkdiv) to the setup signal generator 51.

Referring to FIG. 4B, the control signal generator 57 includes a flip-flop 570, first and second logic units 572 and 574, a NOR gate (NR3), and a NAND gate (ND6).

The flip-flop 570 is initialized by the initialization signal (Reset_dll), receives the start signal (dll_start) at its data input terminal (D), and receives the clock signal (clkdiv) and the inverting signal of the clock signal (clkdiv) at the clock input terminals (clk and clkb).

The first logic unit 572 includes a NAND gate (ND4) and an inverter (IV7), receives the second and third setup signals (Q2 and Q3), and performs an OR operation of the second and third setup signals (Q2 ad Q3). The second logic unit 574 includes a NAND gate (ND5) and an inverter (IV8), receives the first and second setup signals (Q2 and Q3), and performs an OR operation of the first and second setup signals (Q2 and Q3).

The NOR gate (NR3) receives the signal (n2) of the data output terminal (Q) of the flip-flop 570, receives an output signal of the logic unit 572, performs a NOR operation of the received signals, and generates a first control signal (Set).

The NAND gate (BD6) receives the output signal (n3) of the logic unit 574, receives the buffering signal (n4) of the output signal of the data output terminal (Q) of the flip-flop 570, performs a NAND operation of the received signals (n3 and n4), and generates a second control signal (Reset).

Figure 5A:
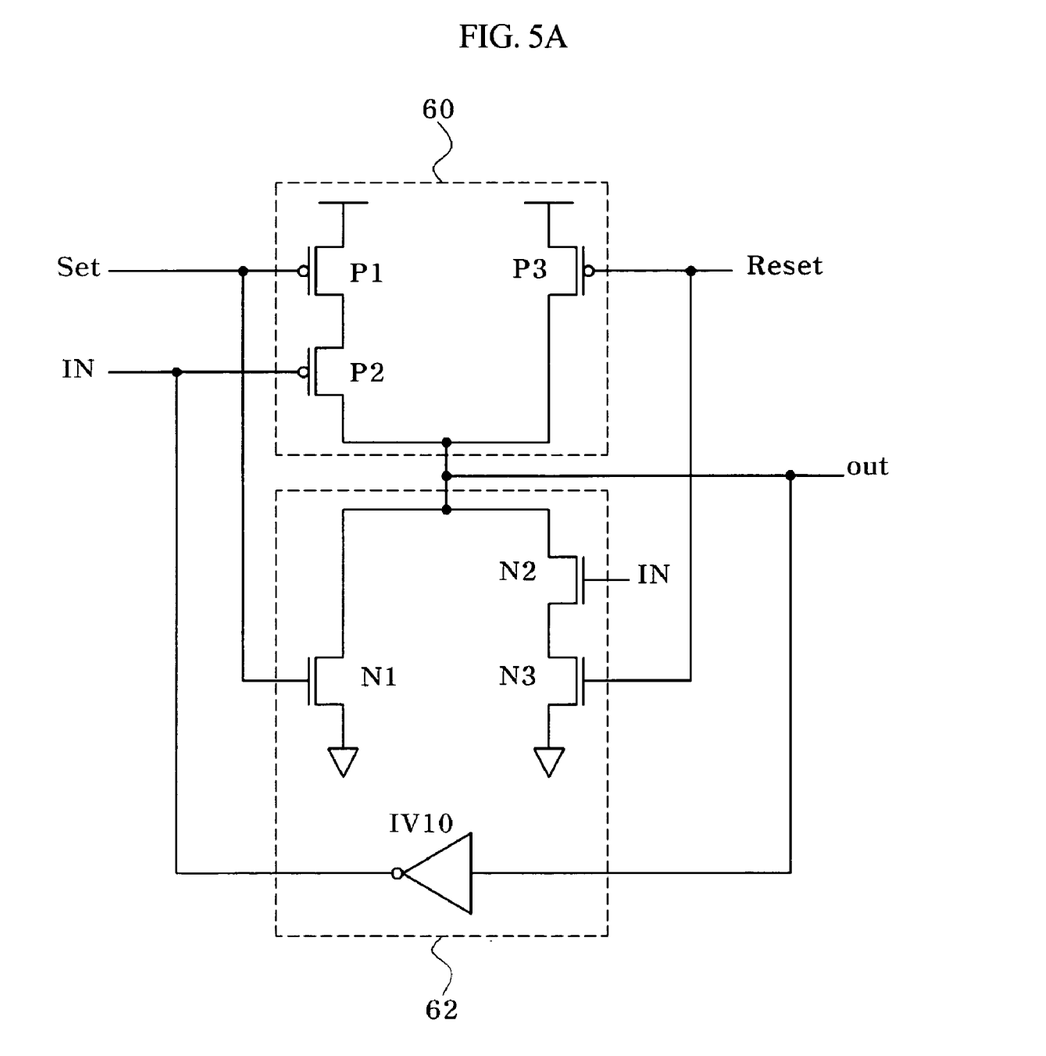
FIGS. 5A and 5B show detailed circuit diagrams illustrating a counter in the DLL shown in FIG. 2.
Figure 5B:
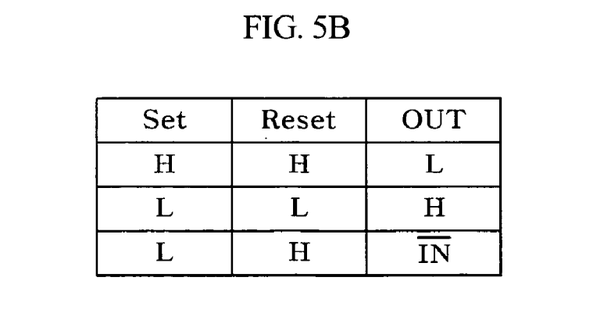

FIGS. 5A and 5B are detailed circuit diagrams illustrating a counter shown in FIG. 2 according to a preferred embodiment.

Referring to FIG. 5A, the counter 6 includes a pull-up drive 60 and a pull-down drive 62. The pull-up drive 60 pull-up drives the first and second control signals (Set and Reset) and the input signal (IN). The pull-down drive 62 pull-down drives the first and second control signal (Set and Reset) and the input signal (IN).

In this case, the pull-up drive 60 includes first and second PMOS transistors (P1 and P2), and a third PMOS transistor (P3). The first and second PMOS transistors (P1 and P2) are connected in series between a power-supply voltage terminal (VDD) and an output terminal of the counter output signal (out), and pull-up-drive the output terminal of the counter output signal (out) in response to the first control signal (Set) and the input signal (IN). The third PMOS transistor (P3) is connected between the power-supply voltage terminal (VDD) and the output terminal of the counter output signal (out), and pull-up-drives the output terminal of the counter output signal (out) in response to the second control signal (Reset).

The pull-down drive 62 includes a first NMOS transistor (N1), and second and third NMOS transistors (N2 and N3). The first NMOS transistor (N1) is connected between a ground terminal (Vss) and the output terminal of the counter output signal (out), and pull-down-drives the output terminal of the counter output signal (out) in response to the first control signal (Set). The second and third NMOS transistors (N2 and N3) are connected in series between the ground terminal (Vss) and the output terminal of the counter output signal (out), and pull-down-drive the output terminal of the counter output signal (out) in response to the second control signal (Reset) and the input signal (IN).

In this case, the circuit configuration of the counter 6 shown in FIG. 5A shows only a specific part for generating the counter output signal (out) upon receiving the first and second control signals (Set and Reset) capable of adjusting the first delay period of the delay line 2. However, FIG. 5A does not show the other circuit for receiving a DLL operation enable signal (up) to operate a conventional DLL, and generating the counter output signal.

The decoder 7 receives at least one counter output signal (out), decodes the received counter output signal (out), and adjusts an enable state of the delay element contained in the delay line 2, such that it adjusts the first delay period of the delay line 2. In this case, the decoder 7 can be implemented with a representative decoder circuit well known to those skilled in the art.

Operations of the above-mentioned DLL will hereinafter be described with reference to FIGS. 2 to 5B.

Referring to FIG. 2, the clock input unit 1 receives external clock signals (CLK and CLKB), and generates an internal clock signal. The delay line 2 delays the internal clock signal by a first delay period serving as an initial delay period. The internal delay 3 delays the output signal of the delay line 2 by a second delay period, and generates a feedback clock signal (fbclk).

In this case, the first delay period is determined by the number of enabled delay elements from among the delay elements contained in the delay line 2. The second delay period is determined by modeling delay elements contained in the DRAM. Also, the enable- or disable-state of the delay element is determined by the decoding signal generated by decoding the counter output signal (out).

The phase detector 4 detects a phase difference between the reference clock signal (refclk) generated from the internal clock signal and the feedback clock signal (fbclk), and generates an enable signal (short_det) according to the detected phase difference.

In more detail, as shown in FIG. 3, the first phase comparator 43 compares a phase of the reference clock signal (refclk) with a phase of the feedback clock signal (fbclk), The second phase comparator 45 compares the phase of the reference clock signal (refclk) with a phase of the feedback clock signal (fbclk) delayed by a third delay period via the delay unit 41. In this case, the first phase comparator 43 and the second phase comparator 45 are respective D-flip-flops. If the signal received in the data output terminal (D) is leading the signal received in the clock input terminal (clk), each phase comparator 43 or 45 outputs a logic high-level signal. Otherwise, if the signal received in the data output terminal (D) is lagging the signal received in the clock input terminal (D), each phase comparator 43 or 45 outputs a logic low-level signal.

Therefore, if the output signals of the first and second phase comparators 43 and 45 are at the logic low level, this means that the reference clock signal (refclk) is lagging the feedback clock signal (fbclk) so that it is delayed by at least third delay period determined by the delay unit 41 on the basis of the feedback clock signal (fbclk). Otherwise, if the output signals of the first and second phase comparators 43 and 45 are at the logic high level, this means that the reference clock signal (refclk) is leading the feedback clock signal (fbclk) so that it is preceded or led by at least third delay period on the basis of the feedback clock signal (fbclk).

In the meantime, if the output signal of the first phase comparator 43 is at the logic low level and the output signal of the second phase comparator 45 is at the logic high level, this means that the reference clock signal (refclk) is delayed by a predetermined delay period less than the third delay period on the basis of the feedback clock signal (fbclk).

In this case, in order to allow the enable signal (Short_det) to enter an enabled state (i.e., a high level), the output signal of the first phase comparator 43 must have the logic low level, and the output signal of the second phase comparator 45 must have the logic high level. As previously stated above, under this situation, the feedback clock signal (fbclk) generated via only the first delay period is almost synchronized with the reference clock signal (refclk). In this case, a delay-period difference between the feedback clock signal (fbclk) and the reference clock signal (refclk) is equal to or less than the third delay period. The third delay period can be freely determined by a user to determine whether the first delay period is sufficiently guaranteed.

If the feedback clock signal (fbclk) is delayed by a predetermined period due to the drop of the operation voltage, and the locking fail occurs, the DLL must recover the locking state by compensating for the locking fail state. However, it is impossible to sufficiently guarantee the first delay period of the delay line to be adjusted for the recovery of the DLL locking state.

As described above, the DLL according to the preferred embodiment enables the enable signal (Short_det) only when the first delay period of the delay line is insufficiently guaranteed, thereby adjusting the first delay period of the delay line. In more detail, as previously stated in the conventional art, if the first delay period of the delay line increases even when the first delay period of the delay line is sufficiently guaranteed, the DLL is very vulnerable to power noise. In order to solve the above-mentioned problem, the DLL enables the enable signal (Short_det) only when the first delay period of the delay line is insufficiently guaranteed.

The delay-period controller 5 for receiving the enable signal (Short_det) generates first and second control signals (Set and Reset). The counter 6 receives first and second control signals (Set and Reset), and generates a counter output signal (out). The decoder 7 decodes the counter output signal (out), and adjusts the first delay period of the delay line. A detailed description thereof will hereinafter be described.

Provided that the number of delay elements contained in the delay line 2 is 64, the decoder 7 decodes 6 counter output signals, such that it adjusts enable- or disable-states of the 64 delay elements. In other words, in the case of establishing an initialized first delay period by enabling 4 delay elements, the combination of 6 counter output signals must be set to "000010" (i.e., a decimal number "4").

In this case, in order to adjust the first delay period by enabling 8 delay elements, the combination of 6 counter output signals must be set to "000100" (i.e., a decimal number "8"). Namely, a counter output signal (out) of a second digit must be changed from "1" to "0", and a counter output signal (out) of a third digit must be changed from "0" to "1".

Therefore, the DLL according to the preferred embodiment includes a plurality of counters 6, each of which can adjust the counter output signals (out) of the second and third digits, and adjusts the counter output signals (out) as described above if the enable signal (Short_det) is enabled, such that the delay line can adjust the first delay period.

As described above, the DLL according to the preferred embodiment includes a plurality of counters 6, such that the delay line can adjust the first delay period using the counters 6. The DLL adjusts the counter output signal (out) generated from each counter 6, such that the delay line adjusts the first delay period. A process for adjusting the counter output signal (out) depending on the enable- or disable-state of the enable signal (Short_det) will hereinafter be described with reference to FIGS. 4A, 4B, 5A, and 5B.

Firstly, a specific case in which the enable signal (Short_det) is enabled at a logic high level and the first delay period of the delay line is insufficiently guaranteed will hereinafter be described.

At an initial operation of the DLL, the setup signal generator 51 and the control signal generator 57 are initialized by the initialization signal (Reset_dll). In more detail, the flip-flops 510, 512, and 514 receiving the enabled initialization signal (Reset_dll) output the initialized first to third setup signals (Q1, Q2, and Q3), and the flip-flop 570 outputs the initialized output signal. Preferably, the first setup signal may be at a logic high level, the second setup signal may be at a logic low level, the third setup signal may be at the logic low level, and the output signal of the flip-flop 570 may be at the logic low level, such that the above-mentioned flip-flops 510, 512, 514, and 570 must be arranged to implement individual logic levels of the above-mentioned signals.

In this case, the flip-flop for receiving the initialization signal (Reset_dll), and generating the signal having another level can be implemented with a circuit well known to those skilled in the art.

Under the above-mentioned initialization state, the start signal generator 53 outputs a low-level start signal (dll_start) by the first setup signal (Q1) of a logic high level, the second setup signal (Q2) of a logic low level, and the third setup signal (Q3) of a logic low level. Therefore, the flip-flop 570 maintains the low-level output signal, such that the first and second control signals (Set and Reset) generated from the control signal generator 57 enter the logic high level. Thereafter, if the high-level first control signal (Set) and the high-level second control signal (Reset) are applied to the counter 6 shown in FIG. 5A, the NMOS transistor (N1) is switched on, such that the counter output signal (out) enters the logic low level.

If the above-mentioned initialization state is completed, the high-level enable signal (Short_det) is synchronized with the clock signal (clkdiv), and is then applied to the flip-flop 510. As a result, the first setup signal (Q1) generated from the flip-flop 510, the second setup signal (Q2) generated from the flip-flop 512, the third setup signal (Q3) generated from the flipflip 514 enter the logic high level. Therefore, the start signal generator 53 outputs a high-level start signal (dll_start), and the control signal generator 57 outputs the first and second control signals (Set and Reset) having a logic low level. If the low-level first and second control signals (Set and Reset) are applied to the counter 6, the PMOS transistor P3 is switched on, such that the counter output signal (out) enters the logic high level. The first delay period of the delay line is adjusted by the high-level counter output signal (out).

Thereafter, the flip-flop 570 receiving the high-level start signal (dll_start) outputs a logic high-level signal, such that the signal (n2) applied to the NOR gate (NR3) enters the logic high level, and the signal (n4) applied to the NAND gate (ND6) enters the logic low level. As a result, the first control signal (Set) generated from the control signal generator 57 enters a logic low level, and the second control signal (Reset) generated from the control signal generator 57 enters a logic high level.

Therefore, the counter 6 outputs the inverting signal ($\overline{IN}$) of the received signal as the counter output signal (out), such that the DLL stops adjusting the first delay period of the delay line, and performs normal DLL operations. In other words, if the adjusting of the first delay period is completed, general operations of the DLL are performed.

Next, a specific case in which the enable signal (Short_det) has the logic low level (i.e., there is no need to adjust the first delay period of the delay line) will hereinafter be described.

Initial operations of the DLL are equal to those of the high-level enable signal (Short_det). Therefore, the start signal generator 53 outputs the low-level start signal (dll_start), the control signal generator 57 outputs the high-level first control signal (Set) and the high-level second control signal (Reset), and the counter 6 outputs the low-level counter output signal (out).

If the above-mentioned initialization state is completed, the low-level enable signal (Short_det) is synchronized with the clock signal (clkdiv), and is then applied to the flip-flop 510. As a result, the first setup signal (Q1) generated from the flip-flop 510, the second setup signal (Q2) generated from the flip-flop 512, the third setup signal (Q3) generated from the flipflip 514 enter the logic low level. Therefore, the start signal generator 53 outputs a high-level start signal (dll_start), and the control signal generator 57 outputs the first and second control signals (Set and Reset) having a logic high level. If the high-level first and second control signals (Set and Reset) are applied to the counter 6, the NMOS transistor N1 is switched on, such that the counter output signal (out) enters the logic low level. If the low-level counter output signal (out) is generated, the first delay period of the delay line maintains a current state without any change.

Thereafter, the flip-flop 570 receiving the high-level start signal (dll_start) outputs a logic high-level signal, such that the signal (n2) applied to the NOR gate (NR3) enters the logic high level, and the signal (n4) applied to the NAND gate (ND6) enters the logic low level. As a result, the first control signal (Set) generated from the control signal generator 57 enters a logic low level, and the second control signal (Reset) generated from the control signal generator 57 enters a logic high level.

Therefore, the counter 6 outputs the inverting signal ($\overline{IN}$) of the received signal as the counter output signal (out), such that the DLL stops adjusting the first delay period of the delay line, and performs normal DLL operations.

In brief, if the enabled enable signal (Short_det) is applied to the delay-period controller 5, the first and second control signals (Set and Reset), each of which has a logic low level, are generated. Upon receipt of the low-level first and second control signals (Set and Reset), the counter 6 outputs the high-level counter output signal (out), such that it can adjust the first delay period of the delay line 2. In the meantime, if a disabled enable signal (Short_det) is applied to the delay-period controller 5, the first and second control signals (Set and Reset), each of which has a logic high level, are generated. Upon receipt of the high-level first and second control signals (Set and Reset), the counter 6 outputs the low-level counter output signal (out).

Operations generated when the above-mentioned DLL operated as described above is applied to the above-mentioned example will hereinafter be described.

As previously stated in the above-mentioned example, it is assumed that the number of delay elements contained in the delay line 2 is 64, and four delay elements from among the 64 delay elements are enabled to establish a first delay period. In this case, the combination of the counter output signals under the 4 delay elements are enabled is denoted by "000010" (i.e., a decimal number "4"). In order to enable 8 delay elements for a guarantee of the first delay period, the combination of 6 counter output signals (out) must be adjusted to "000100" (i.e., a decimal number "8").

For this purpose, the first counter capable of adjusting the counter output signal (out) corresponding to a second digit, and the second counter capable of adjusting the counter output signal (out) corresponding to a third digit are contained in the DLL according to the preferred embodiment. If the enable signal (Short_det) is enabled, the combination of the high-level counter output signals generated from the first and second counters is changed from "000010" to "000100".

In more detail, the delay-period controller 5 generates low-level first and second control signals (Set and Reset) by the enabled enable signal (Short_det), and the first and second counters output the high-level counter output signals (out). Therefore, if the first counter outputs the high-level counter output signal (out), the second digit of the combination of the counter output signals is changed from "1" to "0". If the second counter outputs the high-level counter output signal (out), the third digit of the combination of the counter output signals is changed from "0" to "1".

As apparent from the above description, the DLL according to the preferred embodiment, if an initial delay period of a delay line is less than a delay of a feedback clock signal (fbclk) due to the drop of the operation voltage, increases the initial delay period of the delay line, such that it can guarantee the initial delay period of the delay line used for the recovery of the locking state.

Although the specific embodiments of the present disclosure have been disclosed for illustrative purposes, those skilled in the art will appreciate that various modifications, additions and substitutions are possible, without departing from the scope and spirit of the disclosure and the accompanying claims.

The present application claims priority to Korean application number 10-2006-0059891, filed on Jun. 29, 2006, which is incorporated in its entirety by reference herein.

What is claimed is:

1. A delayed locked loop (DLL) circuit comprising:
a delay line including a plurality of delay elements, and configured to delay an internal clock signal generated by buffering external clock signals by a first delay period;
an internal delay configured to delay an output signal of the delay line by a second delay period determined by modeling delay elements contained in a DRAM, and generate a feedback clock signal;
a phase detector configured to generate an enable signal enabled when a phase difference between the feedback clock signal and a reference clock signal is contained in a predetermined period, and output the enable signal;
a delay-period controller configured to generate in response to the enable signal first and second control signals for adjusting a counter output signal corresponding to at least one delay element selected from among the delay elements;
a counter configured to receive the first and second control signals, and generate a counter output signal corresponding to the at least one delay element; and
a decoder configured to decode the counter output signal, and generate a decoding signal, wherein the decoding signal indicates an enable state of the at least one delay element and adjusts the first delay period,
wherein the delay-period controller includes a setup signal generator for receiving the enable signal and a clock signal, and generating first, second, and third setup signals, a start-signal generator for receiving the first, second, and third setup signals, and generating a start signal, a clock signal transmitter configured to transmit the clock signal to the setup signal generator, in response to the start signal and a control signal generator configured to generate first and second control signals, in response to the start signal and the second and third setup signals.

2. The delayed locked loop (DLL) circuit according to claim 1, wherein the phase detector includes:
a first phase comparator for receiving the feedback clock signal and the reference clock signal, comparing a phase of the feedback clock signal with a phase of the reference clock signal, and generating a first phase comparison signal according to the result of the comparison;
a second phase comparator for receiving a clock signal for delaying the feedback clock signal by a third delay period and receiving the reference clock signal, comparing a phase of the received clock signal with the phase of the reference clock signal, and generating a second phase comparison signal according to the result of the comparison; and
a logic unit for receiving a buffered first phase comparison signal and an output signal of the second phase comparator, performing a logic operation of the received signals, and generating the enable signal.

3. The delayed locked loop (DLL) circuit according to claim 2, wherein the first and second phase comparators are respective flip-flops.

4. The delayed locked loop (DLL) circuit according to claim 2, wherein the logic unit performs a logic AND operation.

5. The delayed locked loop (DLL) circuit according to claim 1, wherein the setup signal generator includes:
first, second, and third flip-flops which are connected in series to each other, are synchronized with the clock signal, and generates the first and second setup signals, in which the enable signal is applied to a data input terminal of the first flip-flop.

6. The delayed locked loop (DLL) circuit according to claim 5, wherein the start signal generator generates the start signal enabled only when the first to third setup signals have the same logic level.

7. The delayed locked loop (DLL) circuit according to claim 6, wherein the start signal generator includes:
a first logic unit for receiving the first to third setup signals, and performing a first logic operation of the first to third setup signals;

a second logic unit for receiving the first to third setup signals, and performing a second logic operation of the first to third setup signals; and a third logic unit for receiving an output signal of the first logic unit and an output signal of the second logic unit, performing a third logic operation of the received signals, and generating the start signal.

8. The delayed locked loop (DLL) circuit according to claim 7, wherein the first logic unit performs a logic OR operation, and the second and third logic units perform a logic NAND operation.

9. The delayed locked loop (DLL) circuit according to claim 1, wherein the clock signal transmitter includes a logic element for receiving the start signal and a buffering signal of the clock signal, and performing a logic operation of the received signals.

10. The delayed locked loop (DLL) circuit according to claim 9, wherein the logic element performs a logic NOR operation.

11. The delayed locked loop (DLL) circuit according to claim 1, wherein the control signal generator includes:

a flip-flop for receiving the start signal at its data input terminal, and receiving the clock signal at its clock input terminal;

a first logic unit for receiving the second and third setup signals, and performing a logic operation of the second and third setup signals;

a second logic unit for receiving a signal of a data output terminal of the flip-flop and an output signal of the first logic unit, performing a logic operation of the received signals, and generating the first control signal; and a third logic unit for receiving an output signal of the flip-flop and an output signal of the first logic unit, performing a logic operation of the received signals, and generating the second control signal.

12. The delayed locked loop (DLL) circuit according to claim 11, wherein the first logic unit performs a logic AND operation, the second logic unit performs a logic NOR operation, and the third logic unit performs a logic NAND operation.

13. The delayed locked loop (DLL) circuit according to claim 1, wherein the counter includes:

a pull-up drive configured to pull-up the first and second control signals and an input signal; and a pull-down drive configured to pull-down the first and second control signal and the input signal.

14. The delayed locked loop (DLL) circuit according to claim 13, wherein the pull-up drive includes:

first and second pull-up elements which are connected in series between a power-supply voltage terminal and a first node at which the counter output signal is generated, and pull-up-drive the first node in response to the first control signal and the input signal; and a third pull-up element which is connected between the power-supply voltage terminal and the first node, and pull-up-drives the first node in response to the second control signal.

15. The delayed locked loop (DLL) circuit according to claim 13, wherein the first to third pull-up elements are respective PMOS transistors.

16. The delayed locked loop (DLL) circuit according to claim 13, wherein the pull-down drive includes:

first and second pull-down elements which are connected in series between a ground terminal and the first node, and pull-down drive the first node in response to the second control signal and the input signal; and a third pull-down element which is connected between the ground terminal and the first node, and pull-down drives the first node in response to the first control signal.

17. The delayed locked loop (DLL) circuit according to claim 16, wherein the first to third pull-down elements are respective NMOS transistors.

18. A delayed locked loop (DLL) circuit comprising:

a delay line including a plurality of delay elements, and configured to delay an internal clock signal generated by buffering external clock signals by a first delay period;

an internal delay for delaying an output signal of the delay line by a second delay period determined by modeling delay elements contained in a DRAM, and generating a feedback clock signal; and a variable delay for generating a control signal to adjust the first delay period of the delay line, when a phase difference between the feedback clock signal and a reference clock signal is contained in a predetermined period wherein the delay-period controller includes a setup sicmal generator for receiving the enable sicmal and a clock signal, and generating first, second, and third setup signal, a start-signal generator for receiving the first, second, and third setup signals, and generating a start signal, a clock signal transmitter configured to transmit the clock signal to the setup signal generator, in response to the start signal and a control signal generator configured to generate first and second control signals, in response to the start signal and the second and third setup signals.

19. The delayed locked loop (DLL) circuit according to claim 18, wherein the variable delay includes:

a phase detector configured to generate an enable signal which is enabled when the phase difference between the feedback clock signal and the reference clock signal is contained in the predetermined period, and output the enable signal; and a delay-period controller configured to generate, in response to the enable signal, first and second control signals for adjusting a counter output signal corresponding to at least one delay element selected from among the delay elements.

20. The delayed locked loop (DLL) circuit according to claim 19, wherein the phase detector includes:

a first phase comparator for receiving the feedback clock signal and the reference clock signal, comparing a phase of the feedback clock signal with a phase of the reference clock signal, and generating a first phase comparison signal according to the result of the comparison;

a second phase comparator for receiving a clock signal for delaying the feedback clock signal by a third delay period and receivincr the reference clock signal, comparing a phase of the received clock signal with the phase of the reference clock signal, and generating a second phase comparison signal according to the result of the comparison; and a logic unit for receiving a buffered first phase comparison signal and an output signal of the second phase comparator, performing a logic operation of the received signals, and generating the enable signal.

21. The delayed locked loop (DLL) circuit according to claim 20, wherein the first and second phase comparators are respective flip-flops.

22. The delayed locked loop (DLL) circuit according to claim 20, wherein the logic unit performs a logic AND operation.

23. The delayed locked loop (DLL) circuit according to claim 18, wherein the setup signal generator includes:

first, second, and third flip-flops which are connected in series to each other, are synchronized with the clock signal, and generates the first and second setup signals, in which the enable signal is applied to a data input terminal of the first flip-flop.

24. The delayed locked loop (DLL) circuit according to claim 23, wherein the start signal generator generates the start signal enabled only when the first to third setup signals have the same logic level.

25. The delayed locked loop (DLL) circuit according to claim 24, wherein the start signal generator includes:
   a first logic unit for receiving the first to third setup signals, and performing a first logic operation of the first to third setup signals;
   a second logic unit for receiving the first to third setup signals, and performing a second logic operation of the first to third setup signals; and
   a third logic unit for receiving an output signal of the first logic unit and an output signal of the second logic unit, performing a third logic operation of the received signals, and generating the start signal.

26. The delayed locked loop (DLL) circuit according to claim 25, wherein the first logic unit performs a logic OR operation, and the second and third logic units perform a logic NAND operation.

27. The delayed locked loop (DLL) circuit according to claim 18, wherein the clock signal transmitter includes a logic element for receiving the start signal and a buffering signal of the clock signal, and performing a logic operation of the received signals.

28. The delayed locked loop (DLL) circuit according to claim 18, wherein the logic element performs a logic NOR operation.

29. The delayed locked loop (DLL) circuit according to claim 18, wherein the control signal generator includes:
   a flip-flop for receiving the start signal at its data input terminal, and receiving the clock signal at its clock input terminal;
   a first logic unit for receiving the second and third setup signals, and performing a logic operation of the second and third setup signals;
   a second logic unit for receiving a signal of a data output terminal of the flip-flop and an output signal of the first logic unit, performing a logic operation of the received signals, and generating the first control signal; and
   a third logic unit for receiving an output signal of the flip-flop and an output signal of the first logic unit, performing a logic operation of the received signals, and generating the second control signal.

30. The delayed locked loop (DLL) circuit according to claim 29, wherein the first logic unit performs a logic AND operation, the second logic unit performs a logic NOR operation, and the third logic unit performs a logic NAND operation.

* * * * *